(12) United States Patent
Frier

(10) Patent No.: US 9,946,901 B2
(45) Date of Patent: Apr. 17, 2018

(54) COMPREHENSIVE RFID AND RADIO COMMUNICATION TEST SYSTEM

(71) Applicant: Robert Frier, Owings Mills, MD (US)

(72) Inventor: Robert Frier, Owings Mills, MD (US)

(73) Assignee: MET LABORATORIES, INC., Baltimore, MD (US)

( * ) Notice: Subject to any disclaimer, the term of this patent is extended or adjusted under 35 U.S.C. 154(b) by 0 days.

(21) Appl. No.: 15/141,077

(22) Filed: Apr. 28, 2016

(65) Prior Publication Data

US 2016/0321475 A1  Nov. 3, 2016

Related U.S. Application Data

(60) Provisional application No. 62/153,777, filed on Apr. 28, 2015.

(51) Int. Cl.
*G08G 1/01* (2006.01)
*G06K 7/00* (2006.01)
*G01R 31/28* (2006.01)
*G07B 15/06* (2011.01)

(52) U.S. Cl.
CPC ....... *G06K 7/0095* (2013.01); *G01R 31/2822* (2013.01); *G07B 15/063* (2013.01)

(58) Field of Classification Search
None
See application file for complete search history.

(56) References Cited

U.S. PATENT DOCUMENTS

| | | | | |
|---|---|---|---|---|
| 5,928,058 A | * | 7/1999 | Francis | A63H 17/36 446/446 |
| 9,283,472 B2 | * | 3/2016 | Platzer | A63H 18/005 |
| 2002/0072294 A1 | * | 6/2002 | Hornsby | A63H 17/28 446/465 |
| 2005/0231689 A1 | * | 10/2005 | Longley | F16M 11/08 352/243 |
| 2016/0264019 A1 | * | 9/2016 | Drako | B60L 15/2045 |

\* cited by examiner

*Primary Examiner* — Adolf Dsouza
(74) *Attorney, Agent, or Firm* — Royal W. Craig; Baker Donelson, PC

(57) ABSTRACT

An improved radio RFID tag and reader system comprising a reduced scale and scalable vehicle fitted with one or more electronic toll collection RFID tags and a track on which the vehicle may operate at a high rate of speed for long periods of time with minimal friction and without derailing or fatigue to the structure of either vehicle or track. The inventive testing system further utilizes a novel vehicle propulsion system comprising counter-rotating wheels adapted to maintain a variable and accurate speed of the vehicle upon each pass by the reader. The propulsion mechanism propels the vehicle down the track past the reader and returns it to a starting point to provide repeated interaction between RFID tag and reader.

20 Claims, 3 Drawing Sheets

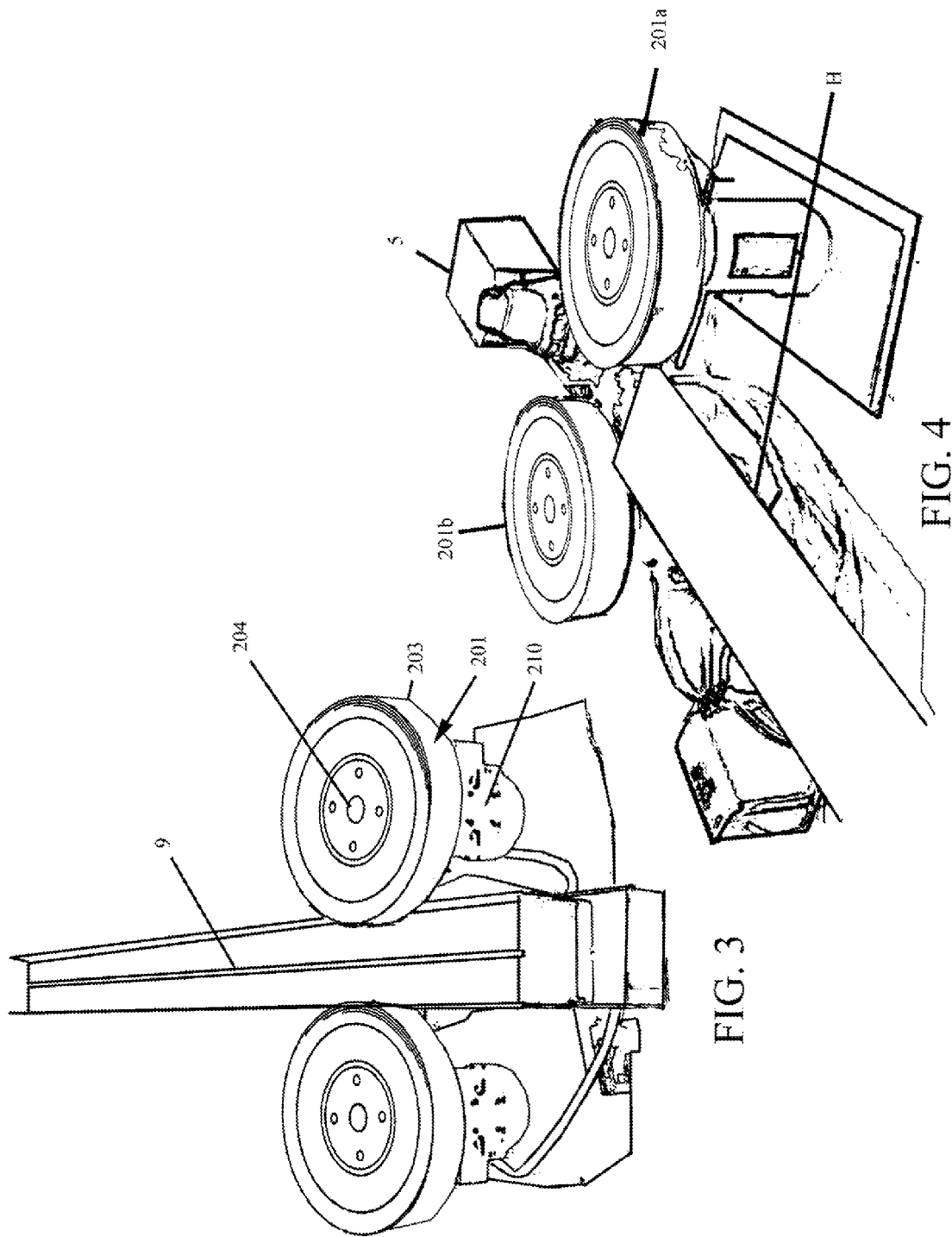

COMPREHENSIVE RFID AND RADIO COMMUNICATION TEST SYSTEM

CROSS-REFERENCE TO RELATED APPLICATION(S)

The present application derives priority from U.S. Provisional Patent Application Ser. No. 62/153,777 filed Apr. 28, 2015.

BACKGROUND OF THE INVENTION

1. Field of the Invention

The present invention relates generally to RFID tag testing systems and, more specifically, to a system for repeatedly propelling a vehicle around a track to automate the process for testing an electronic toll collection reader and RFID tag system.

2. Description of the Background

Radio-frequency identification (RFID) entails the wireless use of radio waves between an RFID tag and a tag reader for the purpose of automatically identifying and tracking an object. The RFID tag includes a RFID tag, capable of receiving a wireless signal, termed an interrogating signal, and responding by emitting an identifying signal unique to the RFID tag. There are a variety of applications for this technology, and RFID tags can be attached to most anything including cash, clothing, merchandise, and can even be implanted in people. One well-known application in the automotive field is in electronic toll collection systems, such as (but not limited to) the E-ZPass™ system used on toll roads in several states in the mid-Atlantic and New England regions. These systems typically comprise one or more readers mounted above one or more toll lanes at the entrance to a toll road, bridge or the like, and emitting a radio signal that is readable by each RFID tag passing underneath in the toll lane. Other electronic toll collection systems utilize one or more readers mounted on or below the travel lane such that vehicles pass over or beside the readers as they travel through the toll plaza. Electronic toll collection systems allow motorists with a RFID tag from an issuing authority to pass through toll stations without making a physical transaction of cash, coins, tickets, etc. and without coming to a complete stop. The toll is paid via a prepaid account or credit card linked to an account, eliminating the need for an exchange of cash or coins. RFID-based toll collection systems have greatly improved the flow of traffic through the toll lanes servicing high traffic toll roads.

As RFID adoption grows, the need to validate tags for interoperability with readers from other vendors, and vice versa, and for conformance with specified wireless protocol increases. Largely as a result of conformance testing, RFID systems have significantly improved over the past several years. However, the current demand is driving mounting pressure to improve tag performance to achieve read rates closer to 100% at higher speeds, RFID test system designers face a significant challenge when attempting to meet the needs of this emerging market. Comprehensive RFID testing is complex, and entails a combination of conformance, interoperability and lifecycle testing. To be more specific, comprehensive RFID testing may require a testing system capable of moving an RFID tag beneath an antenna array at exactly one hundred miles an hour, a thousand times, followed by repeated at ninety miles an hour, eighty, etc. Thus, any designer of such a test system must provide a level of reliability higher than the tags being tested, yet allow accurate testing the operation of the RFID tag/reader combinations under repeated use at most any vehicle speed over extended (lifecycle) periods of time.

Accordingly, what is needed is a test system for precisely and reliably testing conformance, interoperability, lifecycle, range and accuracy of RFID tag and reader combinations over an exceedingly high number of passes (i.e., millions) and at precisely-controllable speeds. Moreover, a scalable test system design is needed to allow various types, sizes and numbers of RFID tags and readers to be tested under the above conditions. Of course, a system for achieving the above objectives will also be safe for the operator, the vehicle, and the surrounding area.

SUMMARY OF THE INVENTION

Accordingly, it is an object of the present invention to provide an improved apparatus for testing various types of RFID tag and reader combinations especially in the context of electronic toll collection systems, capable of passing the RFID tag within an adjustable range of a reader at an adjustable speed a large number of times, all with extreme accuracy.

It is also an object of the present invention to provide such a system capable of carrying out the foregoing with or without operator intervention.

It is further an object of the present invention to provide such a system that is scalable to allow testing of various sizes of RFID tag and reader combinations and at increasing volumes.

It is further an object of the present invention to provide a testing system that is safe for the operator, equipment, and surroundings.

These and other features and benefits are achieved with an improved radio RFID tag and reader system comprising a reduced scale and scalable vehicle fitted with one or more electronic toll collection RFID tags and a track on which the vehicle may operate at a high rate of speed for long periods of time with minimal friction and without derailing or fatigue to the structure of either vehicle or track. The inventive testing system further utilizes a novel vehicle propulsion system comprising a custom designed synchronized motor chive with two or more balanced wheels to maintain a variable and accurate speed of the vehicle upon each pass by the reader.

For a more complete understanding of the invention, its objects and advantages, refer to the remaining specification and to the accompanying drawings.

BRIEF DESCRIPTION OF THE DRAWINGS

Other objects features and advantages of the present invention will become more apparent from the following detailed description of the preferred embodiment and certain modifications thereof, in which:

FIG. 3 is a top perspective view of the improved tracked vehicle propulsion system according to the present invention depicting a vehicle 5 just before it passes through propulsion mechanism 200 at a first end 2a of test area 2.

FIG. 4 is a side perspective view of the track as in FIG. 3.

DETAILED DESCRIPTION OF THE PREFERRED EMBODIMENTS

Figure 1:
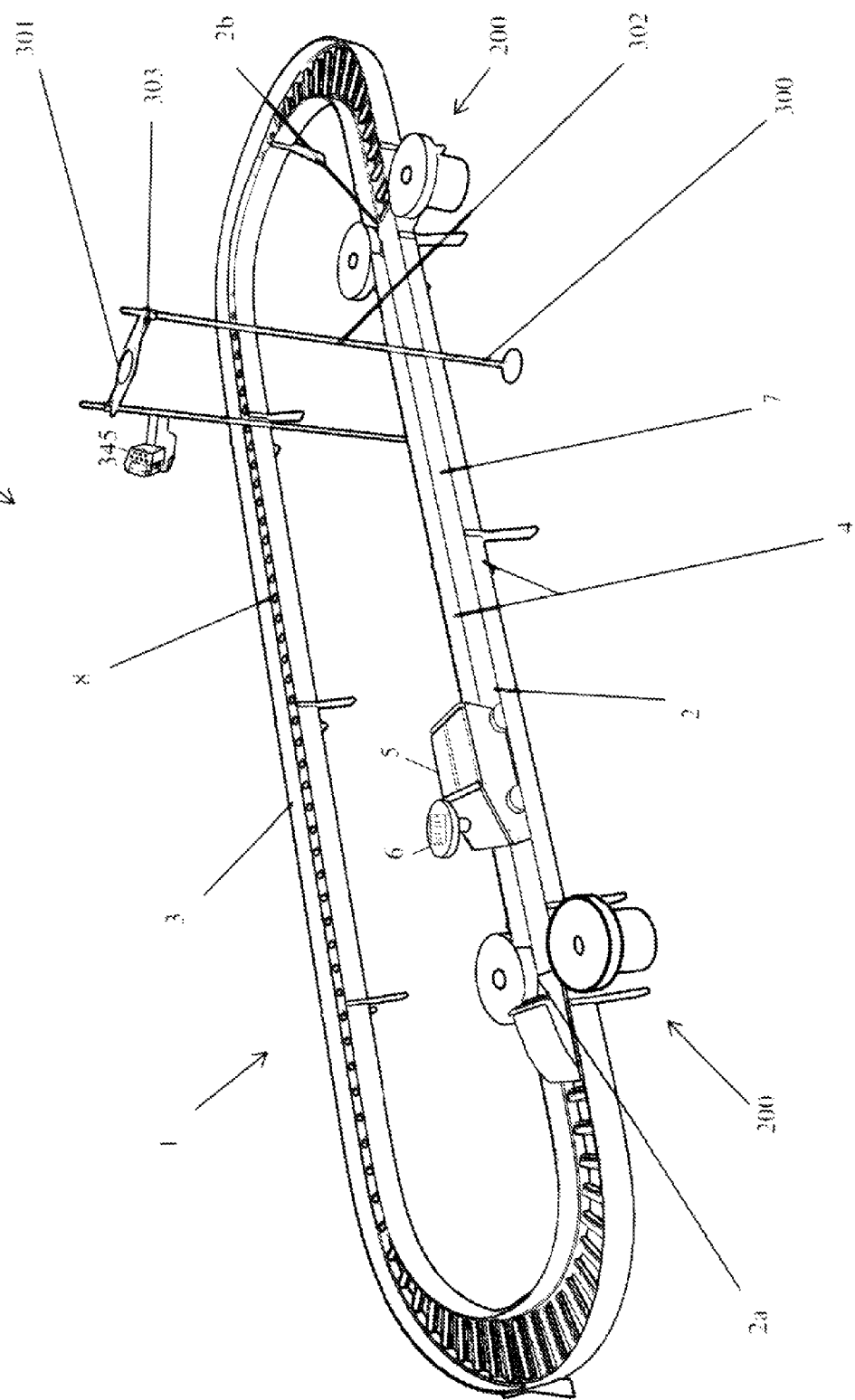
FIG. 1 is a from perspective view of the improved tracked vehicle propulsion system according to the present invention depicting two propulsion systems 200 and one portal 300.

As seen in FIG. 1, a comprehensive test system 100 for testing RFID tag/reader combinations according to an embodiment of the invention generally comprises a track 1 forming a closed circuit or loop, most preferably in the shape of an extended oval, and fitted with one or more rotating-wheel propulsion mechanisms 200. In addition, at least one portal 300 is provided comprising an elevated mount for supporting an RFID reader of antenna directly above the track 1. A passive moving vehicle 5 rolls and/or slides freely on the track 1. In a preferred embodiment the moving vehicle 5 is constrained on the track 1 by vertical sidewalls, but one skilled in the art will understand that a slot-car mechanism is also possible as described below. Vehicle 5 is sized as necessary as a matter of design choice to carry one or more electronic toll collection RFID tags 6 being tested. The portal 300 comprises a pair of vertical freestanding legs with a height-adjustable cross-beam mounted there atop for supporting a reader 301. Although portal 300 is shown as a freestanding mount extending above the travel surface to allow vehicle 5 to pass underneath, it will be understood that a reader 301 or antenna (described further herein) may be positioned at various locations relative to passing vehicle 5, with or without the need for an accompanying portal 300 mount, based on reader 301 accuracy, the location of RFID tag 6 on vehicle 5, as will be described, or other considerations. The track 1 is configured with opposing side-walls to define a channel of appropriate size to substantially constrain the vehicle 5 to forward and rearward motion. The preferred propulsion mechanism 200 comprises two counter-rotating wheel assemblies 201. The wheels 201 are speed-synchronized and may be direct-driven by motors 210 as shown. Motors 210 are preferably high-speed DC brushless motors with integrated speed controllers capable of operating at 4000 rpm with power rating of from 200-700 watts. Wheels 201 are mounted such that the space between the peripheries of opposing wheels 201 is slightly less than the width of vehicle 5. The vehicle 5 is momentarily pinched between the wheels 201 and expelled at a speed ranging between 0-100 mph. The vehicle 5 and portal 300 are designed cooperatively such that the portal 300 mount holds one or more RFID reader(s) 301 each at a measured and preferably-adjustable distance from the one or more RFID tags. In use, the counter-rotating wheels 201 of propulsion mechanisms 200 propel the vehicle 5 around the track 1 at a predetermined speed and, as its RFID tags 6 pass underneath reader 301 at a predetermined distance, the system effectively simulates field use of the RFID tag/reader combination, allowing precise and reliable testing for conformance, interoperability, lifecycle, range and accuracy of the RFID tag and reader combination over months or years of use.

One skilled in the art should understand that multiple vehicles 5 can be run sequentially on the same track 1. Similarly, multiple propulsion mechanisms 200 may be provided as shown in FIG. 1 to reduce or maintain the speed of vehicle 5 around remote portions of the track 1. Propulsion mechanism(s) 200 control the speed of vehicle(s) 5 as they pass under RFID tag 301 to within accurate increments of 15 mph or less. Propulsion mechanisms 200 are capable of propelling vehicles 5 at speeds of 100 mph or more for as long as testing is desired. Thus, for example, if the total length of track 1 is 0.002 miles (approx. 11 feet), a vehicle 5 traveling at 100 mph is capable of achieving one million test runs of the electronic toll collection RFID tag 6 and reader 301 system in 20 hours. Two vehicles 5 each containing an RFID tag 6 traveling on the same track 1 under the same conditions would be able to achieve the same number of test runs in 10 hours. However, the precise vehicle 5 speed control afforded by the propulsion mechanism(s) also allows accurate testing of the RFID tag 6 and reader 301 system at slower vehicle 5 speeds, such as those suitable for low-speed electronic toll collection systems comprising an array of toll booths and/or machine operated gates.

Figure 2:
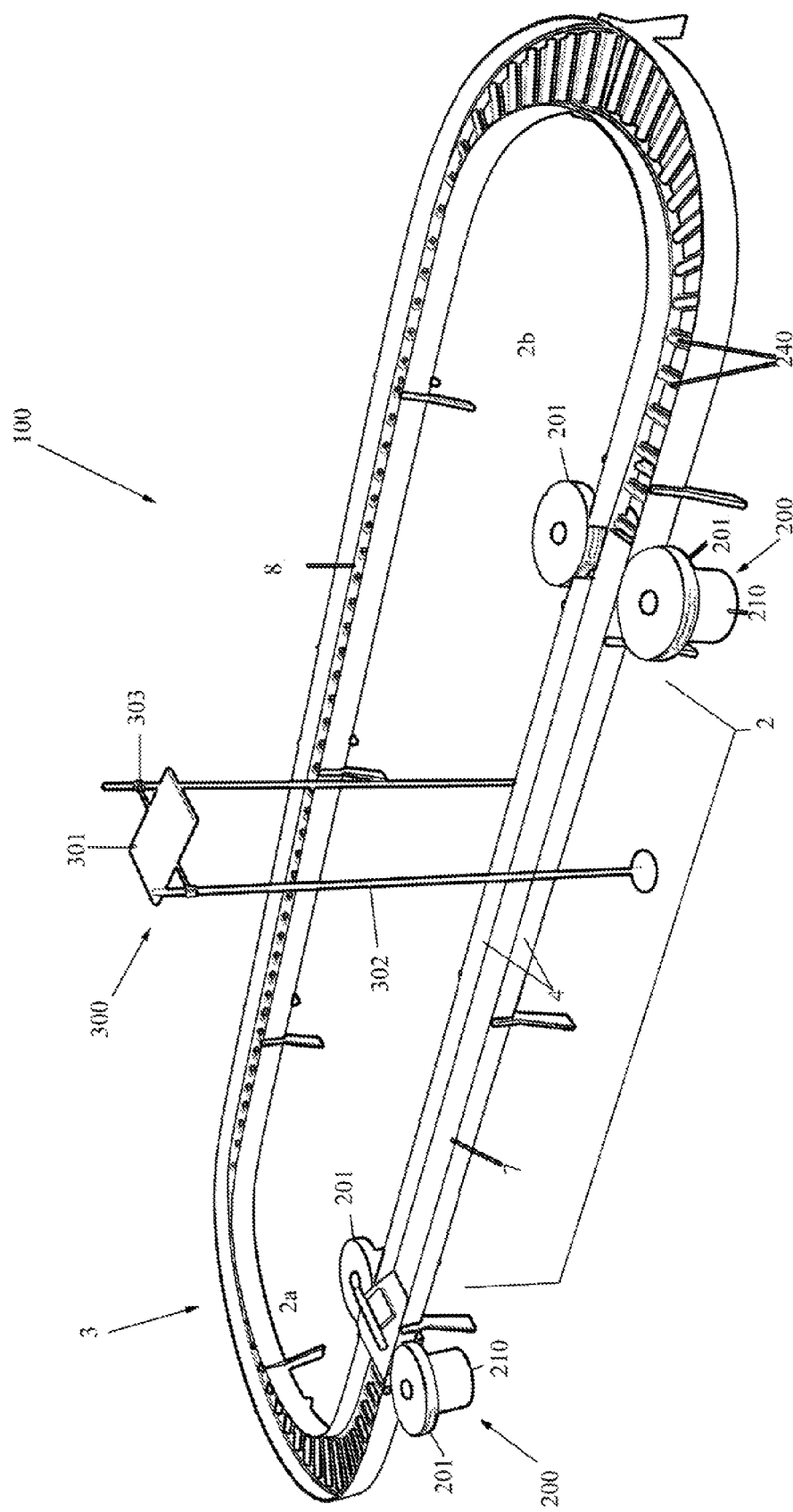
FIG. 2 is a side perspective view of the improved tracked vehicle propulsion system according to the present invention depicting two propulsion systems 200 and one portal 300.

With reference to the embodiment shown in FIGS. 1-2, track 1 preferably comprises a straight testing area 2 and a return loop section 3 which collectively form the preferably oval loop of track 1. As shown in FIGS. 1 and 2, testing area 2 is preferably one of the two main straightaway sections of track 1, and propulsion mechanism(s) 200 are mounted proximate the ends of testing area 2, at least one mechanism 200 at end 2a as shown. The testing area 2 of track 1 preferably comprises a flat, elongate-extended floor surface 7 bordered on each long side by a perpendicular sidewall 4 extending upwards from the floor surface. As seen in FIG. 4, the height H of sidewalls 4 may be determined as a matter of design preference, but is preferably at least ¼ the height of vehicle 5 so as to constrain vehicle 5 within the track of testing area 2 even when traveling at a high rate of speed. And, as shown in FIG. 3, testing area 2 has a width W between sidewalls 4 just slightly wider than the vehicle 5 (described in greater detail below) to prevent vehicle 5 from bouncing between sidewalls 4, and which further ensures that vehicle 5 will continue on a straight path between propulsion mechanism 200 and mount 300 so that a consistent angle is maintained between reader 301 and RFID tag 6.

Portal 300 may be removably or permanently fastened over testing area 2. Portal 300 preferably comprises two extended support legs 302 mounted perpendicularly relative to the travel surface of test area 2 and joined at the top by transverse member 303 spanning the width of testing area 2 above track 1 and supporting reader 301. However, other configurations of mount 300 are envisioned. As shown in FIGS. 1-2 portal mount 300 may be a freestanding member that can be moved into place straddling testing area 2 at various locations along the length thereof. Alternatively, portal 300 may be supported by an attachment to the sidewalls 4 or other portion of testing area 2 with or without a stand allowing portal 300 to rest on the ground beside track 1. A freestanding or removably affixed portal mount 300 may advantageously alloy the electronic toll collection manufacturer or testing body to adjust the location of reader 301 relative to propulsion mechanism 200 to achieve the desired characteristics of the interaction between RFID tag 6 (not shown) and reader 301. In use, portal mown 300 is preferably situated in the lengthwise half of testing area 2 proximate second end 2b. Optionally, a radar gun 345 or other known tool for measuring the speed of vehicle 5 may be mounted on or near portal mount 300 to measure the speed of vehicle 5 as it passes under portal mount 300. In addition, any other means of securing reader 301 in the appropriate location to interact with a passing RFID tag 6 may be used without departing from the spirit of the instant invention. For example, reader 301 may be mounted underneath a portion of testing area 2 to capture signals from a RFID tag 6 mounted on the underside of vehicle 5, at a height above the surface of testing area 2 that is less than the anticipated height of vehicle 5, and/or may be omitted altogether in favor of a direct attachment of reader 301 to testing area 2. Where a separate antenna is used to send an interrogating signal to RFID tag 6, such an antenna is not necessarily mourned adjacent to the RFID reader 301.

The propulsion mechanism(s) 200 are designed to propel vehicle 5 from the one end 2a to the other end 2b end of testing area 2, or vice versa. Accordingly, vehicle 5 passes through propulsion mechanism 200 and travels down a short length of testing area 2 before passing reader 301. Track 1 (and specifically, testing area 2) is preferably constructed of steel or another hard, smooth material that is able to withstand repeated traffic and apply a minimal amount of friction to test vehicle 5. This will ensure that vehicle 5 only loses a small amount of speed after leaving propulsion mechanism 200 and before encountering reader 301. The speed of vehicle 5 as it passes reader 301 can thus be accurately controlled to within only a few miles per hour, or less with the use of a speed measuring radar or like tool mounted proximate reader 301.

At the second end 2b of testing area 2, testing area 2 is joined to the return loop 3 portion of track 1, which completes the loop of track 1 back to the first end 2a of testing area 2. Optionally, as shown in FIGS. 1-2, a propulsion system 200 may be mounted at the second end 2b of testing area 2 or at one or more locations along return loop 3 for braking, speed reduction and/or to maintain propulsion of the vehicle 5 back around to the first end 2a of testing area 2, where it re-encounters the other propulsion mechanism 200 mounted there for another pass by reader 301. The loop of track 1 is continuous so that the vehicle 5 motion may remain continuous for unattended operation over days or even weeks. Like testing area 2, return loop 3 may be formed of a flat surface 8 lined by sidewalls 4, which may form a continuous loop around the entirety of track 1. The roadbed 8 may be solid, or, as shown in FIGS. 1-2, may be comprised of a plurality of spaced independently-movable rollers 240 mounted to provide a relatively friction-free passage to vehicle 5. Return loop 3 may take any shape that guides vehicle 5 to turn 360 degrees in traveling back to the first end 2a of testing area 2. Preferably, however, return loop 3 forms a "U" shape at either end of track 1 with a relatively straight portion along the side of track 1 opposite testing area 2 as shown in FIG. 1, wherein the "U" shape formed by return loop 3 at either end of track 1 is wide enough to prevent vehicle 5 from flying off of track 1 when propelled at high speeds by propulsion mechanism(s) 200. The portion of sidewall 4 at the outer edge of each "U" turn of return loop 3 may have an increased height H to prevent this as well.

Vehicle 5 may be any type of object capable of being propelled by propulsion mechanism 200 and moving in a straight line down testing area 2, but is preferably a model of a box truck-type vehicle having a roughly rectangular portion to provide a smooth surface to interact with sidewalls 4 mounted on three (3) or more wheels to provide relatively friction-less movement down metal testing area 2. As an alternative to wheels, vehicle 5 may ride atop low-friction sleds or runners. A rectangular, box-shaped vehicle 5 also provides ample flat surface on which any of the most common types of electronic toll payment RFID tags 6 may be mounted by, i.e., industrial Velcro® or any other (preferably non-permanent) securement means known in the art.

With reference to FIG. 3, in a preferred embodiment, the roadbeds 7, 8 of testing area 2 and return loop 3 may instead be formed by two extended flat surfaces mounted side by side within the plane of the roadbed with a slotted gap 9 there between running the length of the track 1. Slot 9 may be sized to cooperatively engage with a bracket or rod (not shown) on the base of vehicle 5. By way of example, vehicle 5 may further comprise an extended (1-4") bar mounted in the center of its underside and extending perpendicularly down from the underside of vehicle 5 such that the rod is captured within slot 9 when vehicle 5 is situated on track 1. Such a rod should have a diameter slightly less than the width of slot 9 to prevent any friction from building up between these elements but also to allow the cooperation of slot 9 and the rod to hold vehicle 5 within a straight path along, track 1. Such rod preferably has a "bulb" or T-shaped bracket on its distal end to prevent the rod from moving vertically up and out of slot 9. This feature may be removable from the rod, or the rod may be movable from vehicle 5, to allow vehicle 5 to be removed from track 1 to allow testing with another vehicle.

As described above, track 1 further includes one or more propulsion mechanism(s) 200 mounted thereon, at least one such propulsion mechanism 200 being mounted at a first end 2a of test area 2 where vehicle 5 begins its trip through test area 2 towards reader 301. As best shown in FIG. 3, propulsion mechanism 200 comprises two mirror image motorized wheels assemblies 201 mounted permanently or removably on either side of track 1. Wheels 201 are mounted horizontally, parallel to the plane of roadbeds 7, 8, and have an axis of rotation perpendicular to the plane of roadbeds 7, 8, so as to display an angular rotation parallel to the plane of the roadbeds 7, 8. Alternatively, wheels 201 may be mounted vertically, perpendicular to the plane of roadbeds, 7, 8, to propel vehicle 5 through the application of force on both top and bottom of vehicle 5. Preferably, a motor 210 is mounted below each wheel 201 to provide the proper axis of rotation. Motors 210 may be servo-controlled, pulley drive, or the like provided they are capable of synchronous counter-rotation at the same angular velocity. Alternatively, one motor may be used to provide power to rotate both wheels 201 in synchronization using a serpentine pulley drive. Motors 210 are synchronized so as to provide the same angular velocity to both wheels 201 but in opposite directions. As described above, the two wheels 201 of each propulsion mechanism 200 are preferably mounted on either side of track 1. The distance between wheels 201 across track 1 is preferably slightly less than the width of vehicle 5 to enable each wheel 201 to come into contact with a side of vehicle 5 as it passes through propulsion mechanism 200. In an alternative embodiment, where wheels 201 are mounted above and below the passing vehicle 5, the distance between wheels 201 is preferably slightly less than the height of vehicle 5 to enable each wheel to come into contact with a corresponding horizontal surface of vehicle 5. Because the system is scalable and designed for use with different types of vehicles 5 carrying different types of electronic toll collection RFID tags 6, wheels 201 and motor(s) 210 may be mounted on a sliding track perpendicular to the direction of travel of vehicle 5 along test area 2 such that the distance between wheels 201 may be adjusted in a lateral direction (or, where wheels 201 are mounted vertically, in a vertical direction). Where vertically-mounted wheels 201 are used, the upper wheel 201 may also be mourned on an axel outfitted with a spring or other device to allow upper wheel 201 to be forced upward upon the passing of vehicle 5 there beneath, wherein the operation of a spring or other device or the gravity acting on the weight of upper wheel maintains sufficient downward force on upper wheel 201 to allow wheel 201 to apply force to the top of vehicle 5 to project it forward. Such a configuration may thus be adjustable for various vehicles 5 having different heights. Wheels 201 also preferably have a sufficient height at an outer edge thereof to allow contact between the outer edges of wheels 201 and the sides of vehicles 6 of various heights. Thus, wheels may preferably have a height of 1-4 inches at an outer edge thereof. As best seen in FIG. 4, wheels 201 preferably extend slightly into and overhang roadway 7, 8 to allow contact between the outer edges of wheels 201 and the sides of vehicle 5, which, as described above, is slightly more narrow than roadbeds 7, 8. To accommodate, this, depending on the height of sidewalls 4, sidewalls 4 may include a portion of lessened height proximate each wheel 201 as compared to the remainder of sidewalls 4.

Wheels 201 preferably comprise a round rubber pneumatic tire 203 mounted to a hub 204, which in turn may be connected directly or indirectly to the drive mechanisms of motors 210. The tires preferably utilize a soft-tread design for grip, and are preferably inflated to 20-40 lbs pressure to provide sufficient elasticity to enable them to deform slightly as vehicle 5 passes between them. The friction coefficient between wheels 201 and vehicle 5 should be high to maximize the force with which the angular velocity of wheels 201 will propel vehicle 5 forward, and yet minimize scuffing of the vehicle 5. The rubber of wheels 201 may be provided with an adherent white coating, or may be fabricated from a white material, such as polyurethane, to preclude any discoloration of the vehicle 5. The pressure for the two wheels 201 must be maintained at substantially identical and prescribed levels in order to obtain uniform propulsion.

Alternatively, wheels 201 and/or motor(s) 210 may be mounted on a gimbal to allow wheels 201 to angle slightly towards or away from track 1 so that wheels 201 can spread apart slightly as vehicle 5 passes through and close around the tail end of vehicle 5 to further propel vehicle 5 forward. Vehicle 5 may also have a portion of extended width at a height corresponding to the height of the outer edges of wheels 201 to facilitate a smooth physical interaction between wheels 201 and vehicle 5 as it passes there between.

When viewed from the back of vehicle 5, the wheel mounted on the left of vehicle 5 (201a) is geared to move in a counter-clockwise direction when viewed from the top (above track 1 where vehicle 5 rests) and the wheel mounted on the right of vehicle 5 (201b) is geared to move in a clockwise direction when viewed from the top.

Motors 210 preferably comprise sufficient torque to maintain an axial rotation of up to 100 mph in each wheel 201, and adjustability of same in increments of, at most, 15 mph. Thus, the operator may adjust the speed of vehicle 5 as it proceeds down test area 2 and passes reader 301 by adjusting the speed of motors 210. In this way, vehicle 5, carrying one or more RFID tags 6 of the type typically used by electronic toll collection systems, can be caused to pass within range of an reader at variable, controllable speeds.

Although well suited for use with RFID tags 6 and corresponding readers 301, it will also be understood that the herein described test system 100 may also advantageously be used to test other types of wireless transmission systems operating as between moving objects. Other useful applications for test system 100 may be found in wireless transmission systems that operate between two or more moving vehicles traveling in proximity to one another, between moving vehicles and infrastructure not limited to electronic toll collection systems, and the like.

It should now be apparent that the above-described system provides an improved way of testing various types of REID tag and reader combinations by passing the RFID tag within an adjustable range of a reader at an adjustable speed a large number of times, all with extreme accuracy, and without a teed for operator intervention, effectively simulating the operation of an electronic toll collection reader and RFID tag system over months or years of use prior to installing same on an actual toll road.

Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

I claim:

1. A test system for testing radio frequency identification (RFID) tag and reader combinations over numerous passes at precisely-controlled speeds, comprising:
a guide track configured in a continuous loop for a track-based vehicle;
a passive vehicle held captive in said track for travelling a plurality of revolutions about said continuous loop, said vehicle having a mount for an RFID tag;
a stationary mount for supporting an RFID reader at a fixed point proximate said track; and
a propulsion mechanism for propelling said vehicle about said track, said propulsion mechanism further comprising a counter-rotating pair of wheels mounted on opposing sides of said guide track and each having a fixed-stationary axis of rotation for gripping and propelling said vehicle there about by frictional engagement, and at least one motor for driving both of said wheels at a synchronous speed (rpm).

2. The test system for testing radio frequency identification (RFID) tag and reader combinations according to claim 1, wherein said guide track is configured in a continuous oval having two straightaways.

3. The test system for testing radio frequency identification (RFID) tag and reader combinations according to claim 1, wherein said RFD reader mount is positioned on one of said two straightaways.

4. The test system for testing radio frequency identification (RFID) tag and reader combinations according to claim 1, wherein said vehicle has four wheels and said guide track comprises a horizontal roadbed and spaced vertical walls on both sides of said roadbed for constraining said vehicle therein.

5. The test system for testing radio frequency identification (RFID) tag and reader combinations according to claim 1, wherein said vehicle has four wheels and a guide pin, and aid guide track has a guide slot for receiving said vehicle guide pin.

6. The test system for testing radio frequency identification (RFID) tag and reader combinations according to claim 1, wherein said RFID reader mount is elevated overhead said guide track.

7. The test system for testing radio frequency identification (RFID) tag and reader combinations according to claim 1, wherein said motor drives both of said pair of wheels by a belt drive.

8. The test system for testing radio frequency identification (RFID) tag, and reader combinations according to claim 1, wherein said at least one motor comprises two motors each configured for directly driving one of said wheels.

9. The test system for testing radio frequency identification (RFID) tag and reader combinations according to claim 8, wherein said two motors are variable-speed-controlled synchronous drive motors.

10. The test system for testing radio frequency identification (RFID) tag and reader combinations according to claim 1, wherein said counter-rotating pair of wheels comprises rubber tires for frictional engagement.

11. A system for testing wireless transmission systems, comprising a track;
   a receiver support stand mounted proximate said track;
   a propulsion mechanism operatively connected to said track, said propulsion mechanism further comprising,
   two wheels spaced on opposing sides of said track by a fixed distance and each having a fixed stationary axis of rotation perpendicular to the plane of said track, and
   at least one motor operatively connected to said wheels, said at least one motor configured to provide synchronous counter-rotation to said wheels; and
   a non-powered vehicle operatively constrained within said track for momentum motion thereabout, said vehicle having a maximum width approximately equal to the fixed-distance spacing of said two wheels;
   whereby said vehicle is configured for carrying a wireless transmitter past a receiver mounted on said support stand.

12. The system for testing wireless transmission systems according to claim 11, wherein said track is configured in a continuous oval having two straightaways.

13. The system for testing wireless transmission systems according to claim 11, wherein said wireless transmitter is an RFID tag and said receiver is a RFID reader.

14. The system for testing wireless transmission systems according to claim 11, wherein said wireless transmitter and said receiver transmit wireless communications between one another in the form of radio waves, said wireless communications allowing said receiver to identify said wireless transmitter.

15. The system for testing wireless transmission systems according to claim 11, wherein said RFID reader mount is positioned on one of said two straightaways.

16. The system for testing wireless transmission systems according to claim 11, wherein said vehicle has four wheels and said guide track comprises a flat horizontal roadbed and spaced vertical walls on both sides of said roadbed for constraining said vehicle therein.

17. The system for testing wireless transmission systems according to claim 11, wherein said motor drives both of said pair of wheels by a belt drive.

18. The system for testing wireless transmission systems according to claim 11, further comprising two motors each configured for directly driving one of said wheels.

19. The system for testing wireless transmission systems according to claim 18, wherein said two motors are variable-speed-controlled synchronous drive motors.

20. The system for testing wireless transmission systems according to claim 11, wherein said wheels comprises rubber tires for frictional engagement.

* * * * *